United States Patent
Xue et al.

(10) Patent No.: US 7,162,553 B1
(45) Date of Patent: Jan. 9, 2007

(54) CORRELATING HIGH-SPEED SERIAL INTERFACE DATA AND FIFO STATUS SIGNALS IN PROGRAMMABLE LOGIC DEVICES

(75) Inventors: Ning Xue, Fremont, CA (US); Chong H Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 117 days.

(21) Appl. No.: 10/956,684

(22) Filed: Oct. 1, 2004

(51) Int. Cl.
*G06F 13/12* (2006.01)
*H03K 19/0175* (2006.01)

(52) U.S. Cl. .......................... 710/71; 710/305; 326/86; 326/40

(58) Field of Classification Search .................. 326/41, 326/86; 710/71
See application file for complete search history.

(56) References Cited

U.S. PATENT DOCUMENTS

| | | | |
|---|---|---|---|
| 4,852,088 A * | 7/1989 | Gulick et al. ................ 370/413 |
| 5,127,004 A * | 6/1992 | Lenihan et al. ............. 370/525 |
| 6,650,140 B1 * | 11/2003 | Lee et al. ...................... 326/39 |
| 2004/0032282 A1 * | 2/2004 | Lee et al. ...................... 326/39 |
| 2006/0095613 A1 * | 5/2006 | Venkata et al. ............... 710/62 |

* cited by examiner

Primary Examiner—Vibol Tan
(74) Attorney, Agent, or Firm—Fish & Neave IP Group, Ropes & Gray LLP; Robert R. Jackson; Brian E. Mack

(57) ABSTRACT

Status signals that are generated by one or more FIFO buffers in a high-speed serial interface ("HSSI") may be combined with transmitted data samples in order to correlate the status signals to the respective data samples. The combined data and status signals may be transmitted either to the subsequent stages of the HSSI datapath or directly to the PLD via a dedicated path with less latency. The combined data and status signals can be used to determine whether a data sample corresponds to a valid data sample or an idle sequence, thereby allowing a user to control the flow of data.

32 Claims, 4 Drawing Sheets

CORRELATING HIGH-SPEED SERIAL INTERFACE DATA AND FIFO STATUS SIGNALS IN PROGRAMMABLE LOGIC DEVICES

BACKGROUND OF THE INVENTION

This invention relates to high-speed serial interface ("HSSI") circuitry in programmable logic devices ("PLDs"). More particularly, this invention relates to an apparatus and method for correlating data samples received in a HSSI block with status signals generated by one or more first-in first-out ("FIFO") buffers in the HSSI block. Although the invention is described herein primarily in the context of HSSI being implemented in PLDs for clarity, the invention may be applied to other suitable types of communication protocols being implemented in other suitable types of devices.

HSSI is a commonly-used communications interface that is used in a variety of communications applications. For example, HSSI may be implemented in PLDs in order to provide a high-speed interface between the PLD and an external device, such as an application specific integrated circuit ("ASIC"), application specific standard product ("ASSP") or another PLD.

To compensate for potential clock domain differences in a HSSI data stream that is transmitted between two devices, idle characters (one type of "control" character that is transmitted) are typically periodically inserted into the data stream in accordance with most HSSI protocols. Furthermore, the HSSI circuitry typically includes memory elements such as FIFO buffers that store the individual data samples as they are transmitted from one device to the other. Subsequently, whenever data is transmitted faster than the rate at which the data is received, the FIFO buffers may effectively increase the rate at which data is received without losing data by dropping the idle characters from the data stream. On the other hand, the presence of the idle characters increases the rate of the data stream. Nevertheless, when the data is transmitted slower than the rate at which the data is received, the HSSI circuitry may stop transmitting the data stored in the FIFO buffers and instead revert to sending a stream of idle characters to the receiving device, matching the receiving data rate and avoiding a disruption in downstream processing.

Thus, it is seen that the operation of the HSSI circuitry described above typically occurs whenever the level of the FIFO buffer—that indicates how full or how empty the FIFO buffer is—exceeds a threshold (i.e., beyond which the FIFO buffer is "at risk" of becoming full or empty). Such threshold levels may, for instance, be specified by the user or configured by the manufacturer. For example, a FIFO buffer may be considered to be at risk of becoming full when it can only store two more data samples. Similarly, a FIFO buffer may be considered to be at risk of becoming empty when there are only two data samples left in the FIFO buffer.

In addition to monitoring how full or empty a FIFO buffer is for the purpose of deleting or adding idle characters, a FIFO buffer in the HSSI circuitry of a PLD, for example, also transmits status signals to the PLD that indicate how full or empty the FIFO buffer is. These status signals are typically transmitted on a dedicated status line directly from a particular FIFO buffer to the PLD as soon as, or shortly after, the status signals are generated. As a result, the status signals are generally uncorrelated with the transmission of the incoming data samples.

In designing the PLD to support the processing of HSSI data, users typically design the PLD to stop processing when the received data samples correspond to idle characters (known as an "idle sequence") and to resume processing when the received data samples correspond to actual, valid data. To accomplish this, a determination is made as to whether a received data sample corresponds to a valid data sample or an idle character.

In one approach, logic can be designed using programmable logic resources referred to as logic elements ("LEs") in the PLD to detect the transmission of idle characters in the HSSI data stream. However, this approach has several drawbacks, including the additional consumption of LEs in the PLD (which may cause customers to order larger PLDs and thereby incur additional costs), slower PLD performance, and added design time.

In another approach, the FIFO buffer status signals can be correlated with the data samples by measuring and adjusting the latency between the incoming data samples and the corresponding FIFO status signals. Software may be used to compute such latency. Although this approach does not require logic to detect an idle sequence, correlating the FIFO status signals to the data samples is difficult. For instance, the latency of a data sample that is transmitted from an external device to a PLD varies according to a PLD clock frequency that is set by a user. Furthermore, if different bits of a given data sample are transmitted in different physical datapaths, the latency of each datapath needs to be taken into consideration. Because calculating the latency for such signals depends on different factors including the physical routing of the signals (i.e., the datapaths), PLD clock speed, PLD layout, and the process parameters of the PLD, it is difficult to accurately calculate these latencies in order to correlate the FIFO status signals with the data samples.

Accordingly, it would be desirable to provide a more accurate and efficient apparatus and method for correlating data samples and FIFO status signals in a PLD.

SUMMARY OF THE INVENTION

In accordance with the present invention, FIFO status signals that are associated with data samples received as input to the PLD are combined and transmitted to the PLD via HSSI circuitry. If there are multiple FIFO buffers in the HSSI datapath, status signals corresponding to each of the buffers may be combined with its data sample. In one embodiment, for data transmitted from the external device to the PLD, the combined status signals and data samples may then be transmitted through the remaining receiver circuitry and to the PLD. In another embodiment, the combined status signals and data samples may be directly transmitted to the PLD as soon as they are generated, thus bypassing the remaining receiver circuitry and allowing the combined signals to be transmitted to the PLD more quickly.

Combining the FIFO status signals with the associated data samples guarantees which FIFO status signals correspond to which data samples. As a result, PLD users may then be able to accurately determine whether a received data sample corresponds to a valid data sample or an idle sequence. This approach advantageously provides the user with the ability to control the flow of data, in particular the ability to measure and adjust the rate at which data is received so as to achieve optimal data transmission (i.e., with minimal insertion of idle characters).

The present invention offers a savings in gate count cost because additional logic does not need to be created using LEs for detecting the idle characters. In addition, because the combined status signals and data samples are inherently synchronized in hardware, software modeling is not required to correlate the latency between the status signals and data samples. Furthermore, one embodiment of the invention allows for the combined status signals and data samples to be directly transmitted to the PLD or external device as soon as they are generated, thereby reducing the latency in transmitting the combined signals to the PLD or external device.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which.

DETAILED DESCRIPTION OF THE PREFERRED EMBODIMENTS

Figure 1:
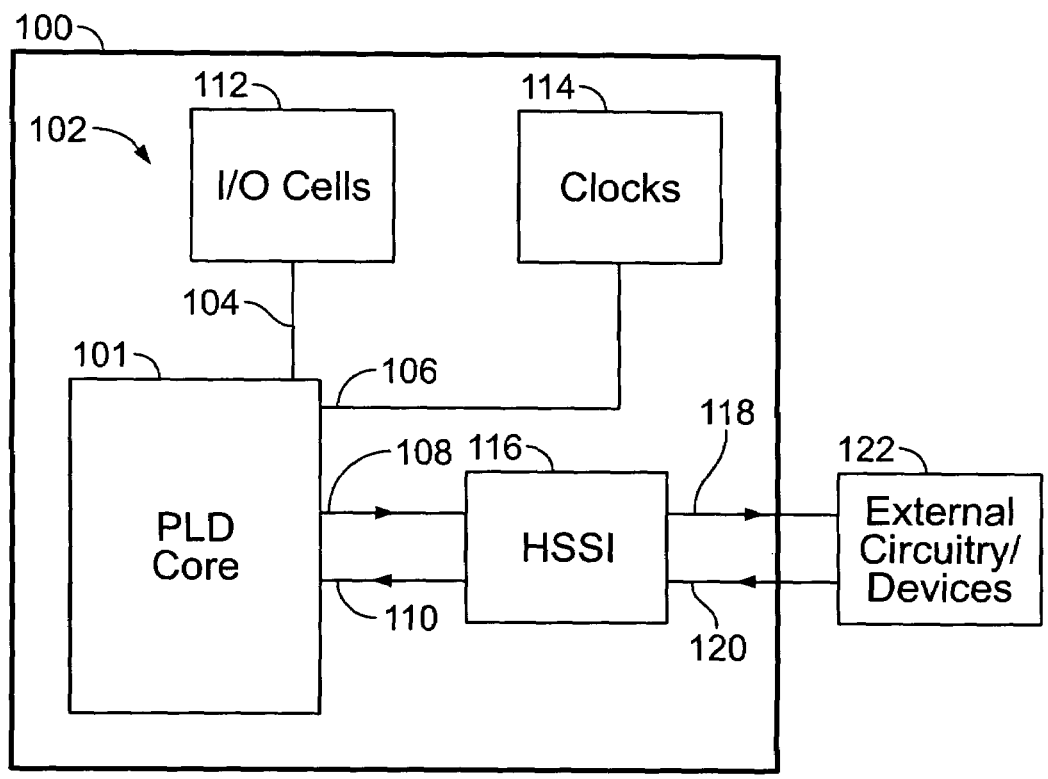
FIG. 1 is an illustrative block diagram of a programmable logic device in accordance with the present invention.

FIG. 1 shows a programmable logic device (PLD) 100 in accordance with the present invention. PLD 100 includes two basic regions: PLD core 101 and a peripherals region 102. PLD core 101 typically includes the user-programmable logic resources of the device (i.e., the logic elements (LEs)). Peripherals region 102 may include specialized regions of circuitry that interface with PLD core 101 such as, for example, input-output ("I/O") cells 112 and clock generation circuitry 114. In FIG. 1, I/O cells 112 and clock generation circuitry 114 interface with PLD core 101 via paths 104 and 106.

Additionally, PLD 100 may include high-speed serial interface (HSSI) circuitry 116 that allows PLD core 101 to communicate with external circuitry 122. In the FIG. 1 embodiment, HSSI circuitry 116 is shown as having a single channel for simplicity. However, as is shown in FIG. 2, it will be understood that HSSI circuitry 116 is typically made up of multiple channels.

HSSI circuitry 116 includes receiver (RX) circuitry having a receive path through which data is transmitted from external circuitry 122 to PLD core 101 and transmitter (TX) circuitry having a transmit path through which data is transmitted from PLD core 101 to external circuitry 122. Data received from external circuitry 122 is sent to receiver circuitry in HSSI circuitry 116 via path 120 and then to PLD core 101 via paths 110. Similarly, data from PLD core 101 is sent to transmitter circuitry in HSSI circuitry 116 via paths 108 and then to external circuitry 122 via paths 118.

Figure 2:
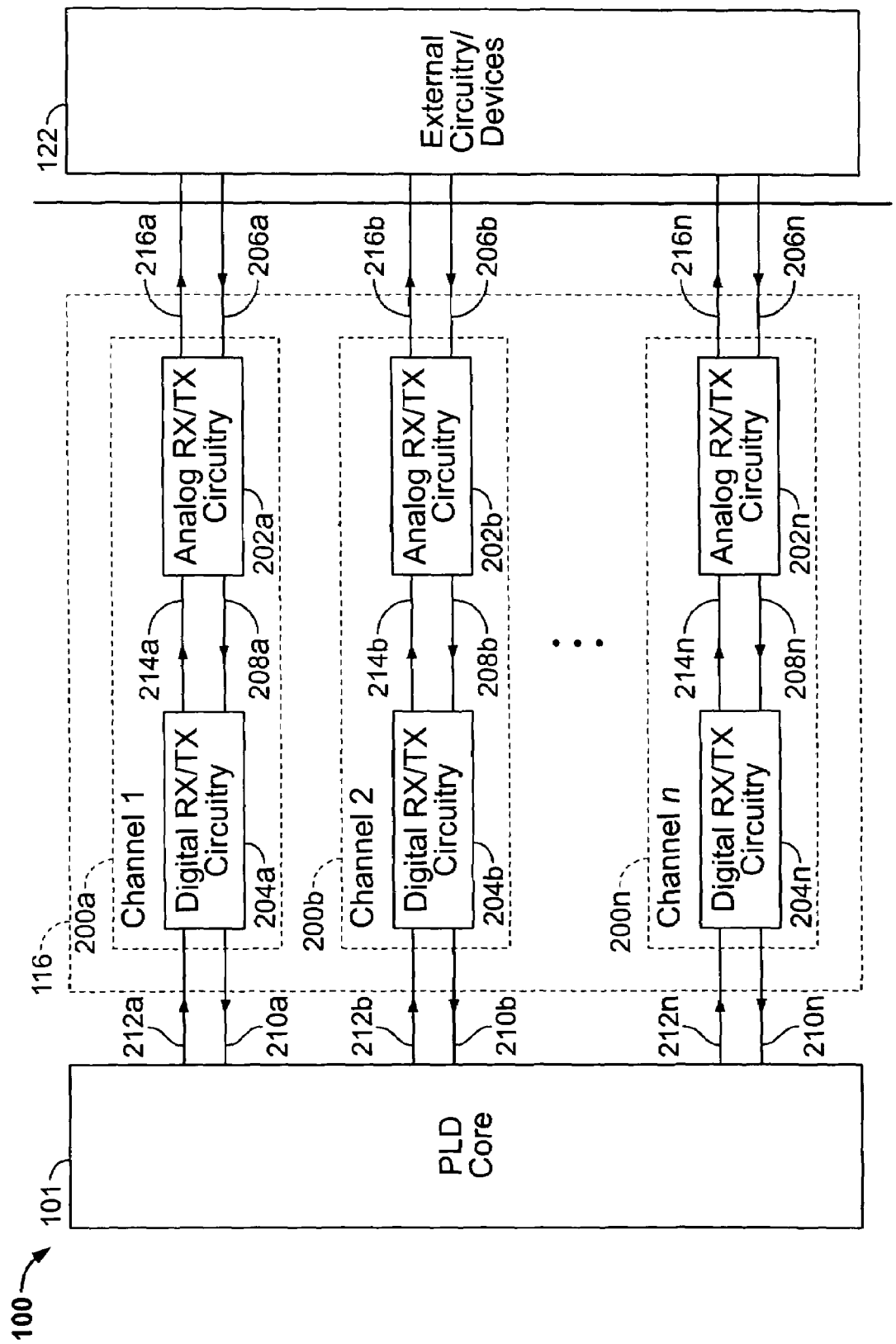
FIG. 2 is a more detailed block diagram of part of the programmable logic device shown in FIG. 1 in accordance with the present invention.

FIG. 2 shows a partial block diagram of PLD 100 that illustrates n-channel HSSI circuitry 116 in more detail. In FIG. 2, HSSI circuitry 116 includes n channels 200$a$–$n$, each of which includes separate analog RX/TX circuitry 202$a$–$n$ (sometimes referred to as the physical material attachment, or PMA) and digital RX/TX circuitry 204$a$–$n$. Data from external circuitry 122 is sent to the receiver circuitry portion of analog RX/TX circuitry 204$a$–$n$ via serial-bit paths 206$a$–$n$. The data signals may be distributed across all channels 200$a$–$n$ via paths 206$a$–$n$. Alternatively, HSSI circuitry 116 may be configured by a user or the manufacturer to operate using only a subset of the available channels 200$a$–$n$. Analog RX/TX circuitry 202$a$–$n$ subsequently converts the analog data signals to digital signals and also extracts a clock signal from the received data using known clock data recovery ("CDR") methods. Analog RX/TX circuitry 202$a$–$n$ further deserializes the serial data for output to the receiver circuitry portion of digital RX/TX circuitry 204$a$–$n$ via parallel-bit paths 208$a$–$n$, each of which may be made up of m parallel bit lines. Digital RX/TX circuitry 204$a$–$n$ processes the incoming data signals on paths 208$a$–$n$ as will be described later with respect to FIG. 3 (e.g., adjusts the timing of and decodes the data), and outputs the processed signals to PLD core 101 via parallel-bit paths 210$a$–$n$. For example, digital RX/TX circuitry 204$a$–$n$ may be used to further deserialize the incoming data for output onto parallel-bit paths 210$a$–$n$. As a result, each of paths 210$a$–$n$ may be made up of more than m parallel bit lines, and typically may comprise 2m bit lines. The deserialization by digital RX/TX circuitry 204$a$–$n$ may be used to further slow down the incoming data when, for example, an application that prompts the communication between PLD 100 and external circuitry 122 requires HSSI circuitry 116 to transmit data at speeds that are greater than the maximum operating speed of PLD 100. Thus, depending on whether or not and the extent to which digital RX/TX circuitry 204$a$–$n$ is used to deserialize the incoming data, all or only a subset of the parallel bit lines in each of paths 210$a$–$n$ may be used. For slower speed applications in which HSSI circuitry 116 operates at or below the maximum speed of PLD 100, the deserialization capability of digital RX/TX circuitry 204$a$–$n$ may be bypassed in order to reduce the logic implementation in PLD core 101 due to the fewer number of bit lines used to transmit the incoming data.

Likewise, data from PLD core 101 is first sent to the transmitter circuitry portion of digital RX/TX circuitry 204$a$–$n$ via parallel-bit paths 212$a$–$n$, each of which may comprise 2m parallel bit lines, for example. The data signals may be distributed across all channels 200$a$–$n$ via paths 212$a$–$n$, or may be configured to operate using only a subset of the available channels. Digital RX/TX circuitry 204$a$–$n$ further processes the data as will described below with respect to FIG. 3. Furthermore, the transmitter portion of digital RX/TX circuitry 204$a$–$n$ in each channel typically includes serialization circuitry that may be used to serialize the data from PLD core 101 (e.g., from 2m to m parallel bits) when, for instance, it is desirable to increase the speed at which HSSI circuitry transmits data to external circuitry 122. The output of digital RX/TX circuitry 204$a$–$n$ is subsequently sent to the transmitter circuitry portion of analog RX/TX circuitry 202$a$–$n$ via parallel-bit paths 214$a$–$n$. Paths 214$a$–$n$ may also comprise 2m parallel bit lines, for example, but may use fewer lines during operation depending on whether or not the data from PLD core 101 was serialized by digital RX/TX circuitry 204$a$–$n$. Analog RX/TX circuitry 202$a$–$n$ converts the data from digital data to analog data, and serializes the analog data onto paths 216$a$–$n$, each corresponding to a single, serial bit line, for output to external circuitry 122.

Figure 3:
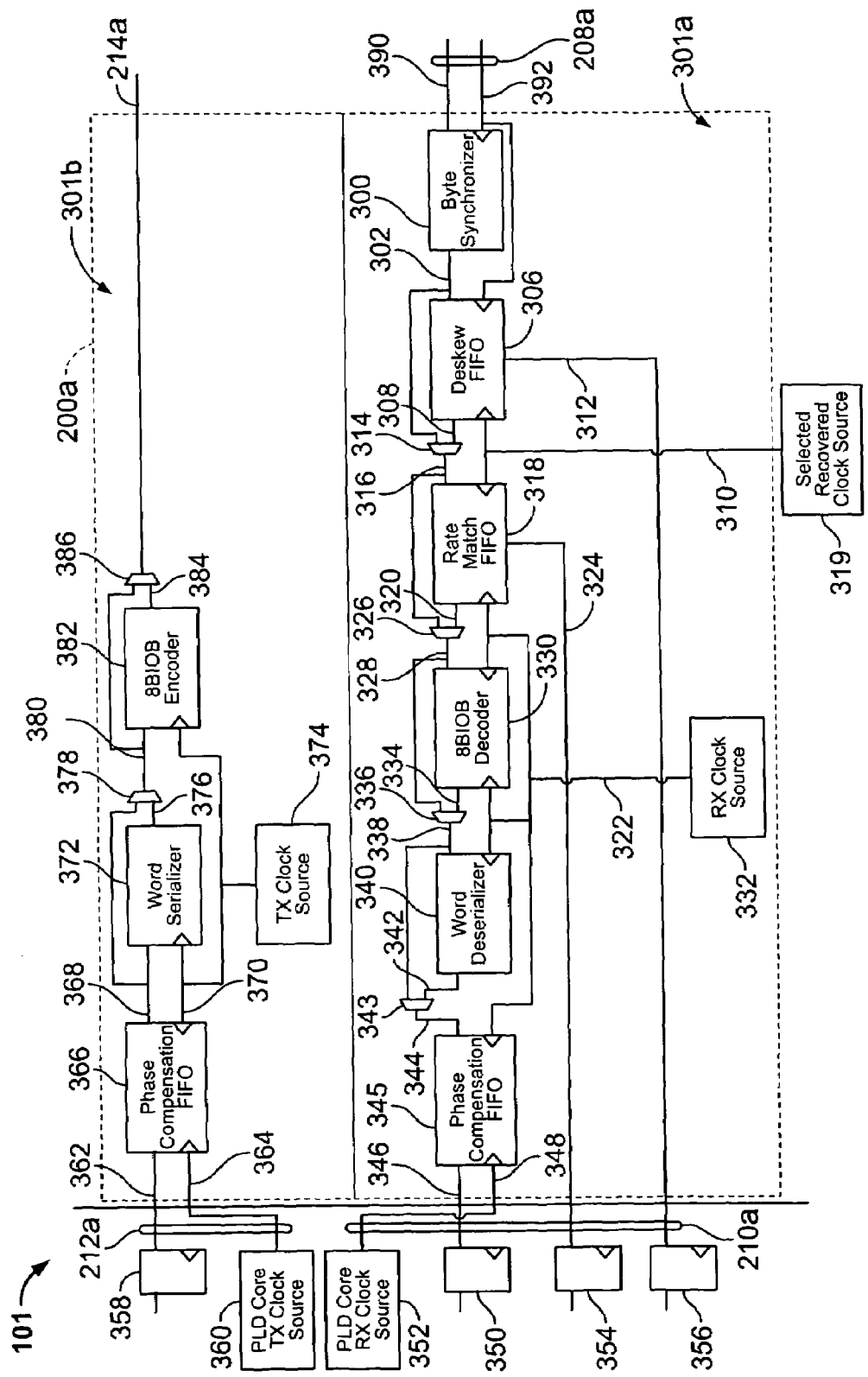
FIG. 3 is a more detailed block diagram of part of the programmable logic device shown in FIGS. 1 and 2 in accordance with the present invention.

FIG. 3 shows a more detailed block diagram of a single digital RX/TX channel 200$a$ of HSSI circuitry 116. Although FIG. 3 is described in connection with digital RX/TX channel 200$a$, FIG. 3 may also be used to describe any one of digital RX/TX channels 200$b$–$n$. Digital RX/TX channel 200a, as shown in FIG. 3, typically includes receiver circuitry 301a and transmitter circuitry 301b.

Receiver circuitry 301a includes byte synchronizer 300, deskew FIFO 306, rate match FIFO 318, 8-bit/10-bit ("8B10B") decoder 330, word deserializer 340, and phase compensation FIFO 345. The corresponding analog RX/TX circuitry transmits data received from external circuitry 122 and the recovered clock signal to byte synchronizer 300 via parallel paths 390 and serial path 392, respectively. Byte synchronizer 300 performs byte or word alignment. For example, byte synchronizer 300 can determine byte or word boundaries in the incoming data by detecting special characters that are transmitted in the data stream. The special characters may be transmitted during the idle sequences, which may indicate the beginning of a new byte or word in the data stream. Once byte synchronizer 300 has detected the special characters, it can realign the data, if necessary, to ensure that each incoming byte or word is aligned with the recovered clock signal. Byte synchronizer 300 outputs the byte-aligned or word-aligned data along parallel paths 302 and the recovered clock signal along serial path 304.

The byte-aligned or word-aligned data is sent along path 302 to deskew FIFO 306 and one of the inputs of bypass multiplexer ("MUX") 314. Deskew FIFO 306 is a buffer that stores the byte-aligned or word-aligned data in a given channel and includes circuitry used to provide channel alignment by removing the skew among the different channels of incoming data. Such skew may be caused by, for example, transmission line length, temperature, or manufacturing (i.e., process parameters) variations among the data reception channels in the high speed serial interface. Methods for providing channel alignment are described, for example, in Lee et al. U.S. patent application Ser. No. 10/093,785, which is hereby incorporated by reference herein in its entirety.

In addition to performing channel alignment, deskew FIFO 306 can also generate status signals that indicate how full or empty the deskew FIFO buffer is. For example, deskew FIFO 306 can generate four categories of status signals that indicate how full the FIFO buffer is: full, near-full, near-empty, and empty. For clarity, deskew FIFO 306 is described herein primarily in the context of generating four categories of status signals, although it will be understood that a greater or fewer number of such status signals may be generated without departing from the scope of the invention. When a particular status signal corresponding to the current state of deskew FIFO 306 is generated, the status signal is combined with the corresponding data byte or word currently being transmitted by deskew FIFO 306. The status signal may be encoded in a series of bits and either appended to the beginning or end of a particular data sample. Transmitting status signals combined with the data samples guarantees that the status signals correlate to the data samples with which they are being transmitted. Users may use the information provided by the correlated status signals to configure PLD 100 to only process valid data samples. In one embodiment, the combined data and status signals output by deskew FIFO 306 can be sent to a second input of bypass MUX 314 via parallel paths 308. In another embodiment, combined data and status signals output by deskew FIFO 306 may be sent directly to PLD core 101 via parallel paths 312. The combined data and status signals received by PLD core 101 via paths 312 may be stored in a single register 356 or in multiple register stages before being processed, or may be immediately processed. It may be desirable to send the status signals via paths 312 when, for example, the user wants to receive the status signals as early as possible with minimal latency. Deskew FIFO 306 also sends as output the clock signal associated with the combined data and status signals via serial path 310. Because the data on paths 308 is now channel aligned, the corresponding clock signal on path 310 has the same phase as the clock signals output by the deskew FIFOs in the other channels of HSSI circuitry 116. The clock signal on path 310 is generated by selected recovered clock source 319. Selected recovered clock source receives the recovered clock signals from each of any number of channels 200a–n shown in FIG. 2, and correspondingly selects a single recovered clock signal for output to the receiver circuitry of each of those channels. In one embodiment of the invention, selected recovered clock source 319 selects a single recovered clock signal from every group of four channels in HSSI circuitry 116.

Bypass MUX 314 allows incoming data to bypass the processing that occurs in deskew FIFO 306. The user may configure the select bit of bypass MUX 314 to select as output onto parallel paths 316 either data that is only byte- or word-aligned (i.e., the data from paths 302), or data that is both byte- or word-aligned and channel-aligned (i.e., the data from deskew FIFO 306 via paths 308). For example, channel alignment functionality may not be desired when the HSSI reception path is configured to use only a single channel to receive data samples. In this case, data from paths 302 may be sent to the output of bypass MUX 314 onto paths 316.

The output of bypass MUX 314 can be sent as input to rate match FIFO 318 and to bypass mux 326. Rate match FIFO 318 is used to adjust the frequency at which data is being output. In particular, rate match FIFO 318 receives the incoming synchronized data via paths 316 and two input clock signals. A first clock signal, received via path 310, corresponds to the rate at which data is received from paths 316. A second clock signal, received via serial path 322, corresponds to the rate at which data is desired to be output onto parallel paths 320. The clock signal on path 322 is provided by RX clock source 332. RX clock source 332 may have the same frequency as but may differ in phase from PLD core RX clock source 352. Furthermore, the rate of RX clock source 332 may vary only slightly from the rate of the clock signal on path 310. Typically, the frequency difference between the input clock signal and the output clock signal is small to prevent the FIFO buffer in rate match FIFO 318 from filling too quickly and thereby causing receiver circuitry 301a to operate inefficiently. In order to accommodate larger frequency adjustments, more memory (i.e., a deeper FIFO buffer that is able to store more information) may be allocated to rate match FIFO 318. Similar to deskew FIFO 306, rate match FIFO 318 may also generate status signal bits. Rate match FIFO 318 combines the status signals with the received data, which may include any status bits generated by deskew FIFO 306. In one embodiment, the combined status and data signals from rate match FIFO 318 may be sent as output onto paths 320. In another embodiment, combined data and status signals from rate match FIFO 318 may be sent directly to PLD core 101 via parallel paths 324. The combined data and status signals transmitted on paths 324 may be stored in a single register 354 or multiple register stages before being processed, or may be immediately processed.

The output of rate match FIFO 318 can be sent as input to bypass MUX 326. Bypass MUX 326 can be selected to output either the output of rate match FIFO 318 or the output of bypass MUX 314. For example, bypass MUX 326 may output data from bypass MUX 314 if no rate matching is to be performed.

The selected output of bypass MUX 326 is subsequently sent as input to 8B10B decoder 330 and to bypass MUX 336. 8B10B decoder 330 receives data from parallel paths 328 and the clock signal from path 322. This received data has been formatted using 8B10B encoding, an encoding method in which 8-bit words are mapped to corresponding 10-bit words. 8B10B encoding advantageously provides the benefits of facilitating bit synchronization, simplifying receiver/transmitter design, improving error detection, and permitting the use of control characters. 8B10B decoder 330 decodes each 10-bit data word formatted using 8B10B encoding into an 8-bit decoded data word for output.

The output of 8B10B decoder can be subsequently sent as input to bypass MUX 336. Bypass MUX 336 can be user-programmed to output either the output of 8B10B decoder 330 or the output of bypass MUX 326, depending on whether the data needs to be decoded. The output of bypass MUX 336 is then sent as input to word deserializer 340 and to bypass MUX 343.

Word deserializer 340 receives as inputs the data output from bypass MUX 336 via paths 338 and the clock signal from path 322. As previously described in connection with FIG. 2, word deserializer 340 may be used to effectively slow down the rate of incoming data from external circuitry 122 by increasing the number of parallel bit lines that the data is output onto. In particular, word serializer 340 receives data from parallel paths 338 and outputs the data onto an even greater number of parallel paths 342 (e.g., from m to 2m bit lines).

The output of word deserializer 340 can be sent to bypass MUX 343. Bypass MUX 343 may be configured to output the either output of word deserializer 340 or the output of bypass MUX 336 from the previous stage. The output of bypass MUX 343 is sent as input to phase compensation FIFO 345 via parallel paths 344.

Phase compensation FIFO 345 adjusts the phase of the data samples received from word deserializer 340 from paths 344. More particularly, phase compensation FIFO 345 writes incoming data from paths 344 to its FIFO buffer at the rate specified by the clock signal from path 322 and reads out data from the FIFO buffer onto paths 346 at the rate specified by the clock signal from PLD core RX clock source 352 via path 348. The combined data and status signals output by phase compensation FIFO 345 are subsequently transmitted to PLD core 101 via parallel output paths 346. The combined signals may be stored in a single register 350 or multiple register stages before being processed, or may be immediately processed.

Unlike receiver circuitry 301a, transmitter circuitry 301b is typically not configured to perform functions (e.g., rate matching) that cause the FIFO buffers in the transmit path to become full or empty under normal operating conditions. As a result, FIFO status signals are not ordinarily generated by such transmitter circuitry. However, based on the foregoing description, it will be apparent to one skilled in the art how to configure the transmitter circuitry 301a to generate combined data and status signals similar to those of receiver circuitry 301b for output to external circuitry 122.

For purposes of clarity and completeness, the operation of transmitter circuitry 301b will be briefly described. Parallel data signals for output by PLD 100 are transmitted along with their associated clock signal to phase compensation FIFO 366 via parallel paths 362 and serial path 364, respectively. Phase compensation FIFO adjusts the phase of the parallel data signals according to the clock signal provided by TX clock source 374 (which has the same frequency as but may differ in phase from PLD core TX clock source 360) via path 370, and subsequently outputs the phase-aligned parallel data signals to word serializer 372 and also to one of the inputs of bypass MUX 378 via path 368. Word serializer 372, which also receives TX clock source 274 as a clock input, may be used to reduce the number of parallel bit lines that are used to transmit the outgoing data from PLD 100, and thereby increase the rate at which the data is transmitted. The reduced number of parallel bit signals from word serializer 372 are sent to a second input of bypass MUX 378 via parallel paths 376. Bypass MUX 378 can then be configured to send the output of phase compensation FIFO 366 or word serializer 372 to both 8B10B encoder 382 and bypass MUX 386 via parallel paths 380. 8B10B encoder 382 may be subsequently used to encode the data received via path 380, and the output of 8B10B encoder 382 is sent to bypass MUX 386 via path 384. Bypass MUX 386 is finally used to select either the encoded data on paths 384 or the unencoded data on paths 380 for output onto parallel paths 214a.

It will be understood that although the present invention is described herein primarily in the context of correlating received HSSI data with status signals generated by various FIFO buffers in the HSSI receiver circuitry for clarity, the invention may also be applied to correlate data transmitted from the PLD with any status signals similarly generated by FIFO buffers in the HSSI transmitter circuitry without departing from the scope of the invention. Furthermore, it will be understood that the present invention is applicable in general to integrated circuit devices besides PLDs where HSSI communication involving other types of buffers besides FIFO buffers can be used.

Figure 4:
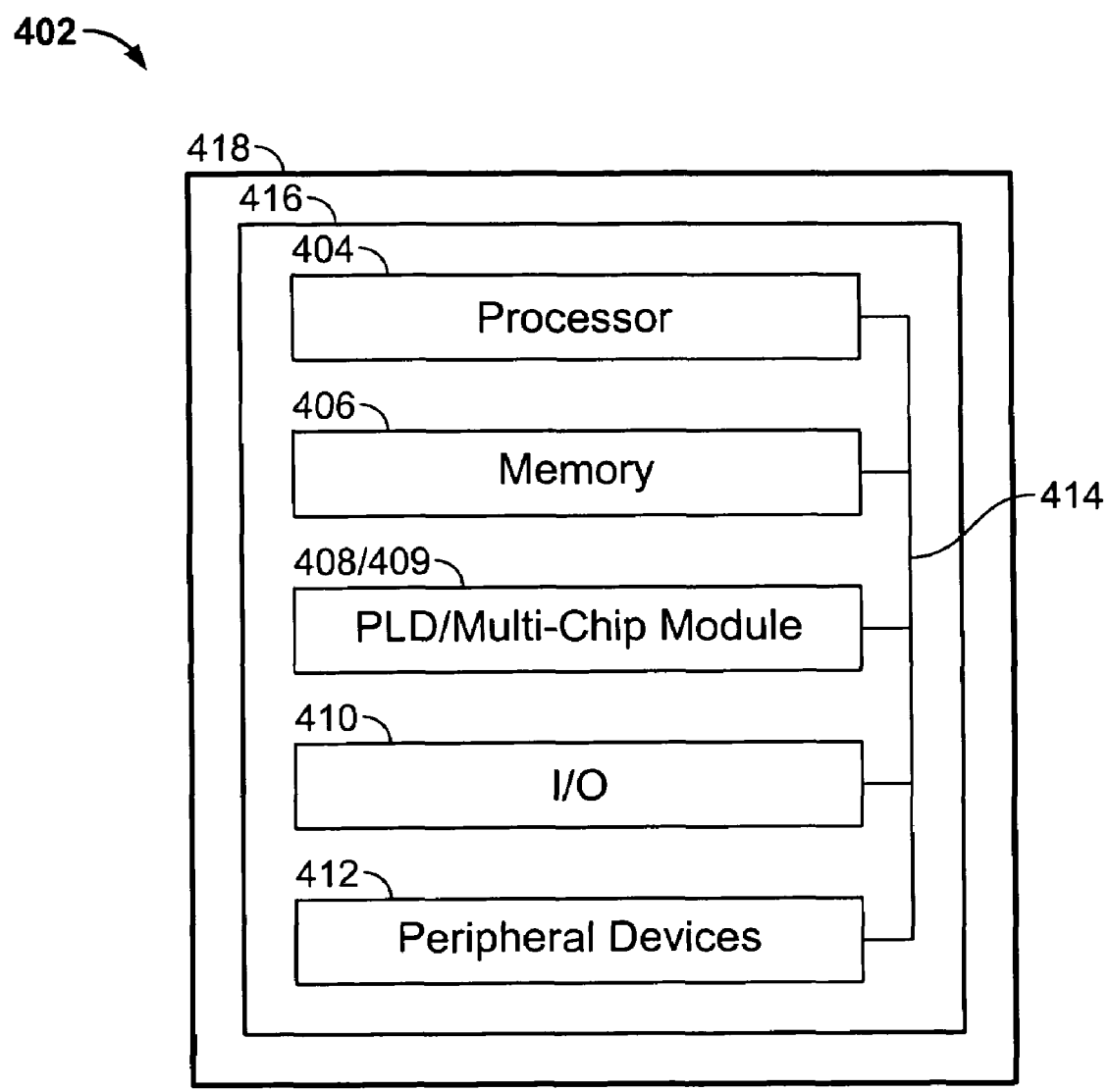
FIG. 4 is a simplified block diagram of an illustrative system employing circuitry in accordance with the present invention.

FIG. 4 illustrates a PLD 408, multi-chip module 409, or other device (e.g., ASSP, ASIC, full-custom chip, dedicated chip) which includes embodiments of this invention in an end-user data processing system 402. Data processing system 402 may include one or more of the following components: a processor 404; memory 406; I/O circuitry 410; and peripheral devices 412. These components are coupled together by a system bus 414 and are populated on a circuit board 416 which is contained in system 402.

System 402 can be used in a wide variety of applications, such as computer networking, data networking, instrumentation, video processing, digital signal processing, or any other application where the advantage of using programmable logic is desirable. PLD/multi-chip module 408/409 can be used to perform a variety of different logic functions. For example, PLD/multi-chip module 408/409 can be configured as a processor or controller that works in cooperation with processor 404. In yet another example, PLD/multi-chip module 408/409 can be configured as an interface between processor 404 and one of the other components in system 402.

Various technologies can be used to implement PLDs 408 or multi-chip module 409 having the features of this invention, as well as the various components of those devices (e.g., programmable logic connectors ("PLCs") and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs include EPROMs, EEPROMs, pass transistors, transmission gates, antifuses, laser fuses, metal optional links, etc. PLCs and other circuit components can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, magnetic RAMs, ferro-electric RAMs, first-in first-out ("FIFO") memories, EPROMs, EEPROMs, function control registers, ferro-electric memories, fuses, antifuses, or the like.

It will be understood, therefore, that the foregoing is only illustrative of the principles of the invention, and that various modifications can be made by those skilled in the art without departing from the scope and spirit of the invention, and that the present invention is limited only by the claims that follow.

What is claimed is:

1. A programmable logic device comprising:
   programmable logic device core circuitry; and
   high speed serial interface circuitry comprising receiver circuitry operative to receive and convert high speed serial data signals to a plurality of parallel data signals suitable for application to the programmable logic device core circuitry, and having at least one first-in first-out (FIFO) buffer operative to receive a data signal, to generate at least one status signal indicative of the amount of data in the at least one FIFO buffer, to combine the status signal with the corresponding data signal, and to send the combined status signal and data signal to at least one subsequent stage of the high speed serial interface datapath or to the programmable logic device core circuitry.

2. The programmable logic device of claim 1 wherein the at least one FIFO buffer is operative to combine the status signal with the corresponding data signal by adding the status signal to the beginning of the corresponding data signal.

3. The programmable logic device of claim 1 wherein the at least one FIFO buffer is operative to combine the status signal with the corresponding data signal by adding the status signal to the end of the corresponding data signal.

4. The programmable logic device of claim 1 wherein the receiver circuitry is configured to send the combined status signal and the corresponding data signal directly to the programmable logic device core circuitry upon generating the status signal.

5. The programmable logic device of claim 1 wherein the receiver circuitry is configured to send the combined status signal and the corresponding data signal to a subsequent processing stage in the receiver circuitry.

6. The programmable logic device of claim 1 wherein the status signal is indicative of whether the data signal corresponds to an idle character.

7. The programmable logic device of claim 6 wherein: the corresponding data signal is not processed when the status signal indicates that the corresponding data signal is an idle character.

8. The programmable logic device of claim 1 wherein the at least one FIFO buffer is part of circuitry operative to receive the high speed serial data signals at a first frequency and to output the high speed serial data signals at a second frequency.

9. The programmable logic device of claim 1 wherein the at least one FIFO buffer is part of circuitry operative to align a plurality of channels of the high speed serial interface circuitry to a single frequency.

10. The programmable logic device of claim 1 wherein the at least one FIFO buffer generates the status signal when the amount of data in the FIFO buffer falls within a predetermined range.

11. The programmable logic device of claim 10 wherein the predetermined range is configurable.

12. The programmable logic device of claim 1 wherein the at least one FIFO buffer generates a plurality of status signals that each corresponds to a different predetermined range.

13. The programmable logic device of claim 1 wherein the high speed serial interface circuitry further comprises transmitter circuitry operative to receive and convert parallel data signals to high speed serial data signals suitable for application to an external device, and having at least one second FIFO buffer operative to receive a second data signal, to generate at least one second status signal indicative of the amount of data in the second FIFO buffer, and to combine the second status signal with the corresponding second data signal for output.

14. A digital signal processing system comprising:
    processing circuitry;
    a memory coupled to the processing circuitry; and
    a device as defined in claim 1 coupled to the processing circuitry and the memory.

15. A printed circuit board on which is mounted a device as defined in claim 1.

16. The printed circuit board defined in claim 15 further comprising:
    a memory mounted on the printed circuit board and coupled to the device.

17. The printed circuit board defined in claim 15 further comprising:
    processing circuitry mounted on the printed circuit board and coupled to the device.

18. An integrated circuit device comprising:
    high speed serial interface circuitry comprising receiver circuitry operative to receive and convert high speed serial data signals to a plurality of parallel data signals suitable for application to the integrated circuit device, and having at least one first-in first-out (FIFO) buffer operative to receive a data signal, to generate at least one status signal indicative of the amount of data in the at least one FIFO buffer, to combine the status signal with the corresponding data signal, and to send the combined status signal and data signal to at least one subsequent stage of the high speed serial interface datapath.

19. A method for correlating high speed serial interface data signals with first-in first-out (FIFO) status signals in a programmable logic device comprising:
    receiving a data signal;
    storing the data signal in at least one FIFO buffer;
    generating at least one status signal indicative of the amount of data in the at least one FIFO buffer;
    combining the status signal with the corresponding data signal; and
    sending the combined status signal and data signal to at least one subsequent stage of the high speed serial interface datapath or to the programmable logic device core circuitry.

20. The method of claim 19 wherein combining the status signal with the corresponding data signal comprises adding the status signal to the beginning of the corresponding data signal.

21. The method of claim 19 wherein combining the status signal with the corresponding data signal comprises adding the status signal to the end of the corresponding data signal.

22. The method of claim 19 further comprising sending the combined status signal and corresponding data signal directly to programmable logic device core circuitry upon generating the status signal.

23. The method of claim 19 further comprising sending the combined status signal and corresponding data signal to a subsequent processing stage in the high speed serial interface circuitry.

24. The method of claim 19 wherein the status signal is indicative of whether the data signal corresponds to an idle character.

25. The method of claim 24 further comprising stopping the processing of the data signal when the status signal indicates that the corresponding data signal is an idle character.

26. The method of claim 19 further comprising:
receiving the data signal at a first frequency; and
sending as output the data signal at a second frequency.

27. The method of claim 19 further comprising aligning the data signal in each of a plurality of channels in the programmable logic device to a single frequency.

28. The method of claim 19 further comprising generating the status signal when the amount of data in the at least one FIFO buffer falls within a predetermined range.

29. The method of claim 28 further comprising generating a plurality of status signals that each corresponds to a different predetermined range.

30. The method of claim 28 wherein the predetermined range is configurable.

31. A method for processing a data sample having a high speed serial interface data signal and a corresponding status signal indicative of the amount of data in a first-in first-out (FIFO) buffer in a programmable logic device comprising:
receiving a data sample having a high speed serial interface data signal and a corresponding status signal;
determining whether the high speed serial interface data signal corresponds to an idle character based on the status signal;
processing the high speed serial interface data signal when the status signal indicates that the high speed serial interface data signal does not correspond to the idle character; and
stopping the processing of the high speed serial interface data signal when the status signal indicates that the high speed serial interface data signal corresponds to the idle character.

32. The method of claim 31 wherein the status signal is indicative of the amount of data in the FIFO buffer.

* * * * *